(12) United States Patent
Jones et al.

(10) Patent No.: US 12,069,590 B2
(45) Date of Patent: Aug. 20, 2024

(54) BEACON OPTIMIZATION

(71) Applicant: The Charles Machine Works, Inc., Perry, OK (US)

(72) Inventors: Klayton Day Jones, Perry, OK (US); Scott B. Cole, Edmond, OK (US)

(73) Assignee: The Charles Machine Works, Inc., Perry, OK (US)

( * ) Notice: Subject to any disclaimer, the term of this patent is extended or adjusted under 35 U.S.C. 154(b) by 282 days.

(21) Appl. No.: 17/531,901

(22) Filed: Nov. 22, 2021

(65) Prior Publication Data

US 2022/0167281 A1 May 26, 2022

Related U.S. Application Data

(60) Provisional application No. 63/117,133, filed on Nov. 23, 2020.

(51) Int. Cl.
| | | |
|---|---|---|
| *H04W 52/24* | (2009.01) | |
| *E21B 7/04* | (2006.01) | |
| *G01R 21/06* | (2006.01) | |

(52) U.S. Cl.
CPC .......... *H04W 52/245* (2013.01); *E21B 7/046* (2013.01); *G01R 21/06* (2013.01)

(58) Field of Classification Search
CPC ....... H04W 52/245; E21B 7/046; G01R 21/06
See application file for complete search history.

(56) References Cited

U.S. PATENT DOCUMENTS

| | | | |
|---|---|---|---|
| 5,589,844 A * | 12/1996 | Belcher | H01Q 23/00 333/32 |
| 7,150,331 B2 | 12/2006 | Cole et al. | |
| 9,425,619 B2 | 8/2016 | Chau et al. | |
| 10,240,456 B2 | 3/2019 | Chau et al. | |
| 2009/0102663 A1* | 4/2009 | Hillegass | H01Q 7/00 340/572.5 |
| 2011/0287732 A1* | 11/2011 | Kakuya | H03H 7/40 455/334 |
| 2013/0176139 A1* | 7/2013 | Chau | E21B 7/046 340/854.4 |
| 2014/0241556 A1* | 8/2014 | Larsen | H04R 3/00 381/316 |
| 2016/0069180 A1* | 3/2016 | Zeller | E21B 7/046 340/854.4 |
| 2017/0155194 A1* | 6/2017 | Kanno | H04B 5/0012 |

* cited by examiner

*Primary Examiner* — Junpeng Chen
(74) *Attorney, Agent, or Firm* — Tomlinson McKinstry, P.C.

(57) ABSTRACT

An optimizable beacon and method of using the same. The beacon has an onboard power source with a finite capacity. The system uses a capacitor bank to adjust the capacitance of the beacon, thereby maximizing the signal provided considering conditions, rather than simply using a theoretical value. With the specified capacitance being used, the beacon may be optimized in both a high and low power mode by driving the current to ensure the measured power is greater than or equal to a target. The system may also have a motion sensor to toggle the power off, or to a low-power mode, when the beacon is moving, and location measurements are not taking place. The optimization process may also consider the chemistry of the battery being utilized.

15 Claims, 5 Drawing Sheets

BEACON OPTIMIZATION

SUMMARY

The present invention is directed to a method. The method comprises determining a theoretical optimum capacitance value for an antenna frequency, performing a series of measurements at an antenna transmitting at the antenna frequency, determining an actual optimum capacitance value for the antenna frequency using the measurements, and storing the actual optimum capacitance value in a memory. Each of the series of measurements is taken with the actual capacitance of the antenna at a value between a first and second boundary capacitance value. The first boundary capacitance is less than the theoretical optimum capacitance value and the second boundary capacitance is more than the theoretical optimum capacitance value.

The invention is also directed to a system. The system comprises an antenna coil, a microprocessor, and a capacitor bank. The antenna coil is configured to transmit a signal at a frequency. The capacitor bank is in electromagnetic communication with the antenna coil and the microprocessor. The microprocessor is configured to perform iterative steps. The iterative steps are adjusting a capacitance of the capacitor bank and detecting a characteristic of the antenna and storing the characteristic in an array.

The invention is also directed to a beacon optimization system. The beacon optimization system comprises an antenna coil, a tunable capacitor bank, a power source, and a microprocessor. The antenna coil is configured to emit a locator signal. The capacitor bank is coupled to the antenna coil. The microprocessor is configured to iteratively modify the capacitance of the tunable capacitor bank to optimize the magnitude of the locator signal at a given frequency and iteratively modify the power supplied by the power source to optimize the current supplied to the antenna coil.

DETAILED DESCRIPTION

Figure 1:
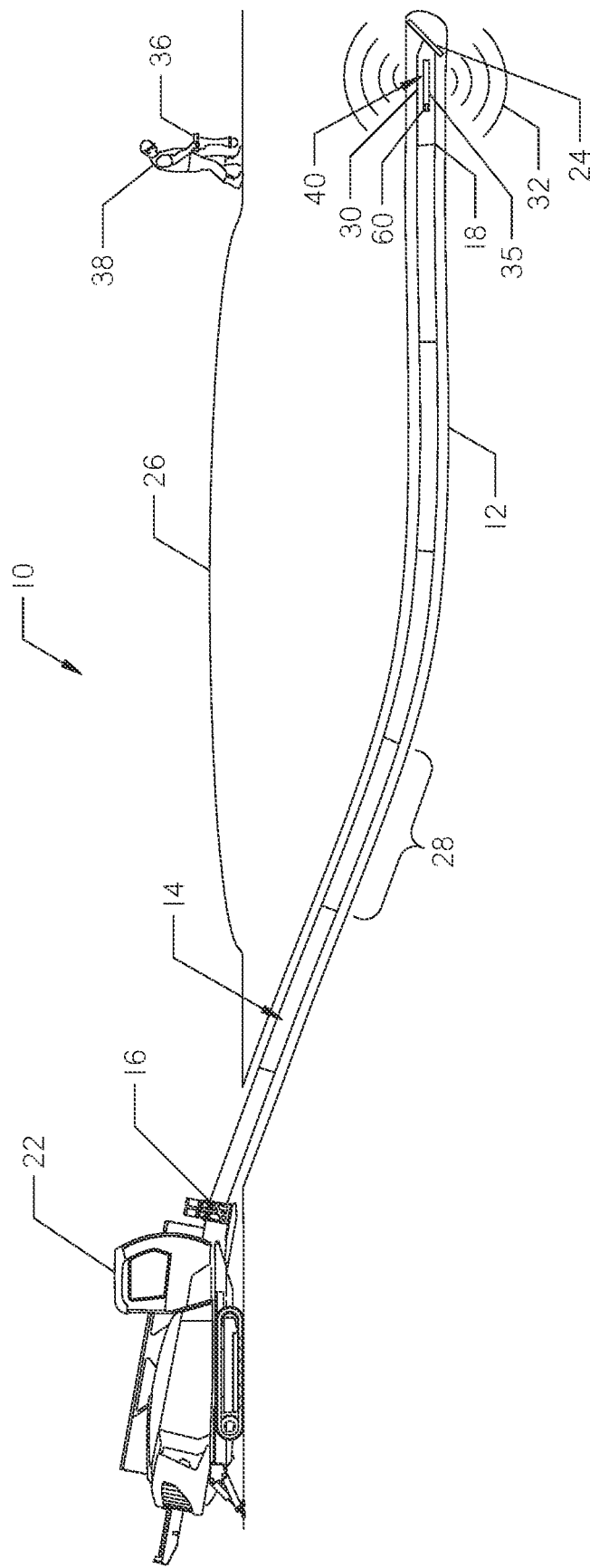
FIG. 1 is an illustration of a horizontal directional drilling operation.

With reference to FIG. 1, a horizontal directional drilling system 10 is shown. The system 10 is used to create a borehole 12 under an above-ground obstacle, such as a roadway. The system 10 uses a drill string 14 having a first end 16 and a second end 18. The drill string 14 is attached to a drill rig 22 at its first end 16 and a drill bit 24 at its second end 18. The drill rig 22 is supported on a ground surface 26 and is operated by a rig operator. The drill string 14 comprises a plurality of hollow pipe sections 28 arranged in an end-to-end relationship. The drill string 14 functions to transmit thrust and rotation force from the drill rig 22 to the drill bit 24.

Continuing with FIG. 1, a downhole tool 30 is attached to the second end 18 of the drill string 14. The downhole tool 30 carries the drill bit 24 and houses a beacon 40. The beacon 40 is configured to emit a beacon signal 32 from the downhole tool 30 at a selected frequency. One or more beacon windows 35 may be formed in the downhole tool 30 for the beacon signal 32 to pass through. The beacon signal 32 is preferably a magnetic dipole field.

An above-ground tracker 36, operated by a tracker operator 38, is used to detect and analyze the beacon signal 32 in order to determine the downhole position of the beacon. The beacon signal 32 includes information about the beacon as well as the downhole conditions, such as the downhole temperature and fluid pressure. In operation, the tracker operator 38 walks along the planned borepath tracking the beacon signal 32 with the tracker 36.

Beacons 40 may use an autotuning process to help maximize the amplitude of the signal these beacons transmit. The beacons 40 have bulk capacitance that is switched into a series resonant circuit with the antenna (an inductor). This bulk capacitance is intended to be close to the calculated capacitance needed to resonate at the given frequency. After this bulk capacitance has been switched into the circuit, there is a bank of smaller capacitors that can be individually switched in to help peak the tuning for this circuit. This is referred to as "autotuning." This autotuning can be very slow and must happen each time the beacon is powered on at a given frequency. While it helps give the beacon better efficiency it may cause calibration and regulation times to be very slow. These types of beacons typically have a maximum of four different frequencies at which to emit the beacon signal 32.

Figure 2:
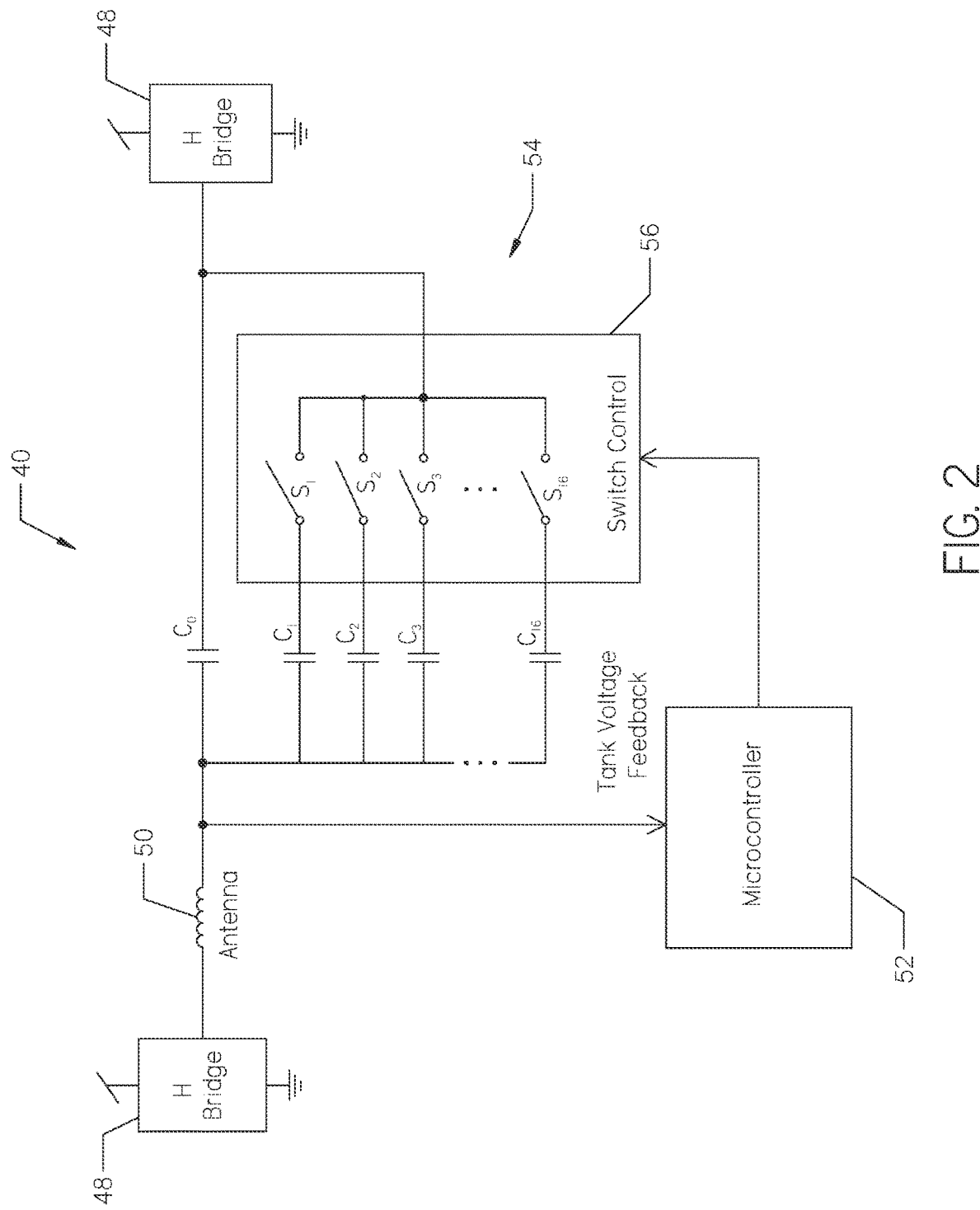
FIG. 2 is an example of an electronic diagram of the binary search capacitor for use in a beacon.

It may be preferable for a beacon 40 to provide thirty-two or more different frequencies at which to emit the beacon signal 32. However, more frequencies mean that the calibration and tuning times must be reduced. The present invention uses a binary search capacitor configuration to achieve a broad tuning range that can support thirty-two frequencies. This capacitor configuration lends itself to being able to optimize the beacon to whatever downhole tool 30 or environment is being used. The capacitor configuration is shown in FIG. 2.

The method for beacon optimization may comprise four separate methods, each of which is designed to improve the performance of the beacon. The first is a tuning optimization. The second is power optimization. Preferably, the power optimization comprises two separate optimization steps—one for normal power and one for high-power. These processes are described below.

A user may further optimize the beacon by determining the capabilities of the beacon's battery prior to operation. A process for determining the capabilities of the beacon's battery is described below. Finally, during operation, the power supplied to the beacon may be reduced or eliminated while the beacon detects movement.

Tuning Optimization

Tuning optimization is intended to maximize efficiency and signal output level for a given frequency in a given housing. Each downhole tool housing 30 has a slightly different effect on the tuning capacitance it takes to peak the signal coming out of the beacon.

Figure 3:
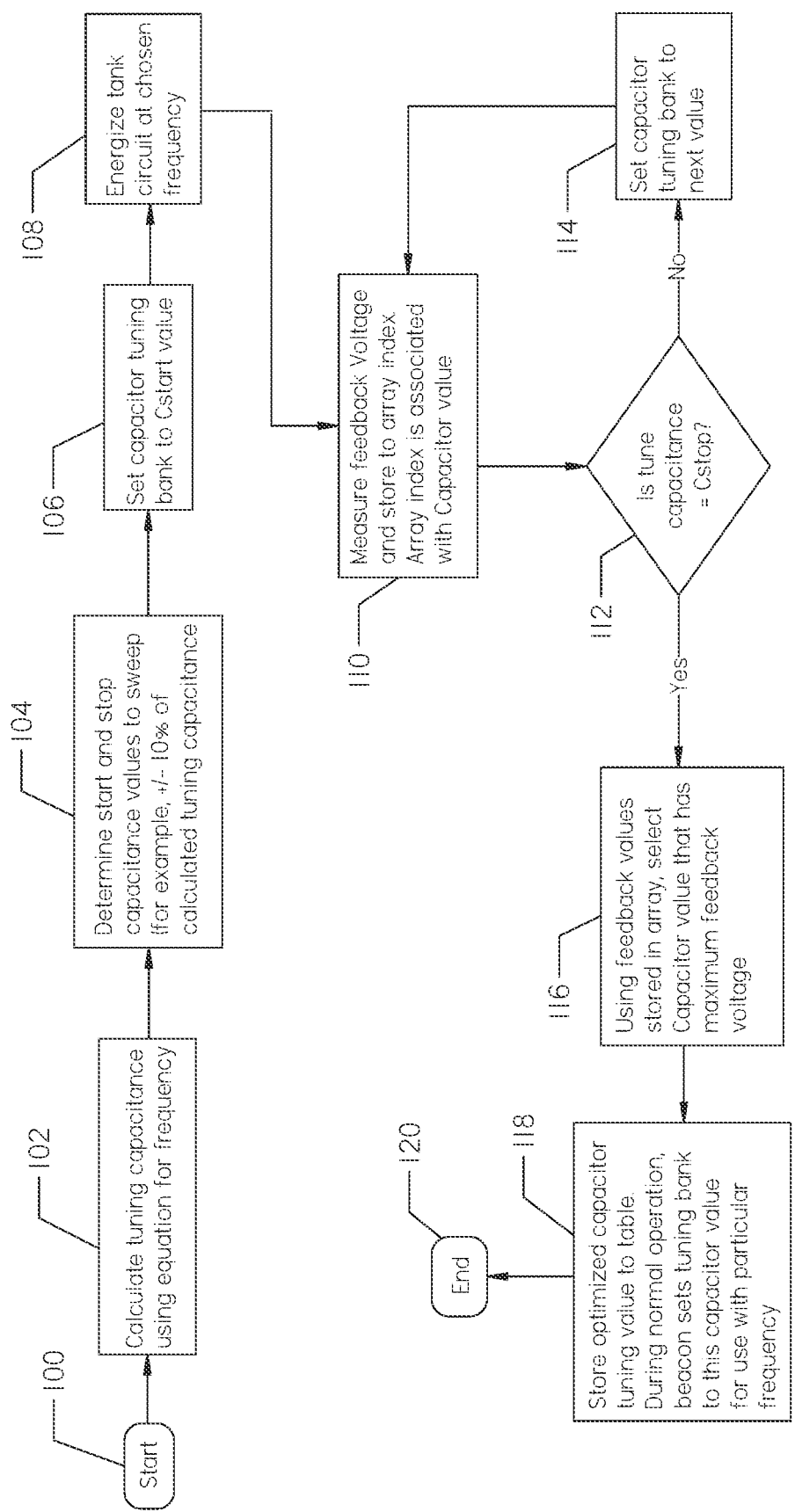
FIG. 3 is a flow chart of one example of a tuning optimization operation.

With reference to FIGS. 2 and 3, a system for performing the tuning optimization is shown. FIG. 2 is a diagrammatic representation of the beacon 40. The beacon 40 comprises an antenna 50, a microcontroller 52, and a capacitor bank 54. The beacon 40 is disposed between H bridge circuits 48.

The capacitor bank 54 comprises a plurality of capacitors, given designations between $C_0$ and $C_{16}$. Capacitor $C_0$ has a bulk value and is always a part of the system. Each of capacitors $C_1$ through $C_{16}$ is arranged in parallel, and each of these capacitors may be toggled by an associated switch $S_1$ through $S_{16}$ disposed in a switch control group 56. As shown, the microcontroller 52 controls the switch control group 56.

While various values may be provided, in one embodiment, the capacitors $C_1$ through $C_{16}$ have capacitance values which are arranged for binary switching. For example, a first of the capacitors may have a value x. The second of the capacitors has a value 2x, the third a value 4x, and so on, such that each discrete arrangement of the switch group 56 results in a different capacitance value provided by the capacitor bank 54. Such an arrangement provides a large range of discrete capacitance values from which to choose.

With reference to FIG. 3, a method for tuning the beacon 40 is shown. The method starts at step 100. At step 102, a theoretical optimum capacitance value is calculated. The optimum capacitance, C, is determined using the antenna inductance, L and transmission frequency, f, according the below equation:

$$C = \frac{\left(\frac{1}{2\pi f}\right)^2}{L}$$

At step 104, a maximum and minimum test capacitance value are determined. In one embodiment, the minimum test capacitance is 10% less than the theoretical optimum capacitance value. Likewise, the maximum test capacitance is 10% more than the theoretical optimum capacitance value. The range may be larger or smaller depending upon the application.

At step 106, the capacitor bank 54 is set to one of the values between the maximum and minimum test value. This may be, but does not have to be, the maximum or minimum value. At step 108, the beacon is energized with the antenna 50 transmitting at the transmission frequency. At 110, a characteristic of the system is recorded and stored in an array, and associated with the particular arrangement of the capacitor bank 54.

The characteristic used at 110 may be feedback voltage, or the current draw from the battery. Other characteristics may be utilized. In any case, the characteristic is indicative of the signal magnitude from the antenna 52, and is stored in a storage.

At 112, the system checks to see if all applicable capacitance values between the maximum and minimum test values have been measured. If no, the capacitor bank 54 is tuned to the next value at 114 and the measurement and storage step at 110 is repeated. It may be preferred to start at the minimum test value and increase the capacitance, stepwise, until the maximum test value is reached, though other methods of testing each capacitor arrangement in the range may be used.

If all available capacitance values in the range have been measured, the system proceeds to step 116. At step 116, the optimum characteristic value is determined, and an actual optimum capacitance value associated with that characteristic value is selected. At step 118, the capacitor bank 54 configuration associated with the actual optimum capacitance value is stored, and associated with the frequency f selected. The method ends at 120.

The method of FIG. 3 may be repeated at each frequency at which the beacon 40 is operated. As a result, the beacon 40 may have, in its storage, an optimum configuration for the capacitor bank 54 for every frequency at which the antenna 50 may operate. This provides tuning to the optimum capacitance while the beacon 40 is within a particular housing without requiring any procedure at start-up. If recalibration is required, such as when the beacon is placed in a new housing, the method of FIG. 3 may be repeated.

Example

The method shown in FIG. 3 may be illustrated with a practical example. For a frequency of 29 kHz, with an antenna inductance of 166 microhenry, the equation given above provides a theoretical optimum capacitance of 181.4 nanofarads at step 102. A 10% sweep may be provided at step 104, which provides a test range of 163.3 to 199.5 nanofarads at step 104. The antenna 50 transmits at 29 kHz and the characteristic is stored for each capacitance value of the sweep.

After the test range is swept, the optimum characteristic value is determined at step 116. For example, this may be the maximum feedback voltage value. The actual optimum capacitance value associated with that characteristic is then stored in a storage at 118. The beacon 40 now has a stored optimum capacitance value for 29 kHz.

This procedure is repeated for each pre-set frequency value, and the optimum capacitance stored. Thus, when the beacon 40 is later set for use at any of its pre-set frequencies, the capacitor bank 54 may be automatically set to the configuration associated with the optimum capacitance value.

Power Optimization

Figure 4:
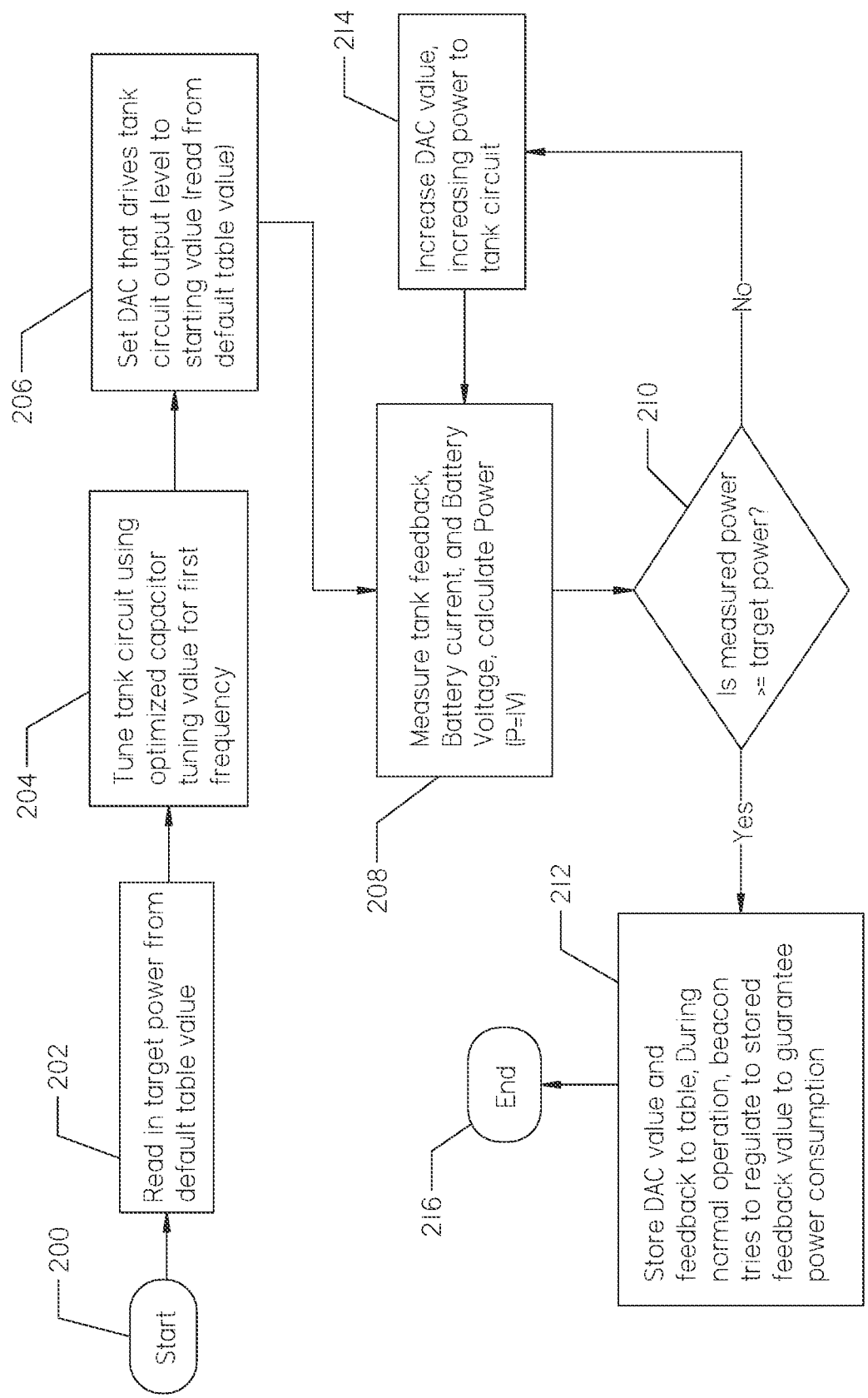
FIG. 4 is a flow chart of one example of a power optimization operation.

After tuning optimization has been completed, power optimization begins using the newly established tuning values. The method of optimizing power levels is disclosed in FIG. 4.

Power optimization sets the power draw consumed by the system at a given power level. This benefits the user by helping provide the specified battery life over all the frequencies and power levels. Power optimization is achieved by ramping up the output signal while monitoring the power pulled from the battery (current*voltage).

The method starts at step 200. A table of acceptable power consumption rates is referenced at 202 to determine a starting power level. The beacon 40 is tuned to the optimum capacitance for the chosen frequency at 204. The beacon is then driven by a digital to analog converter to the starting power level at 206.

Battery current and voltage are then measured at 208 to determine an actual measured power level. If the measured power is greater than or equal to the target power level at 210, the value of the digital to analog converter is set and stored in a storage at 212. If the measured power is less than the target power at 210, the value of the digital to analog converter is increased at 214 and step 208 is repeated. The method ends for a discrete target power level and frequency at 216.

This method may occur for multiple power levels. For example, the beacon may provide a normal and high-power level.

In operation, the user can select if they want to run the beacon optimization or use a default (non-optimized) set of tuning and feedback values. Once the beacon optimization and power optimization are complete, the values stored may be re-used until calibration is required.

Traditionally, a locating beacon 40 is always on, sending the beacon signal 32 to the tracker 36. However, in borepath planning and mapping techniques occur at regular intervals, not continuously. The location of the downhole tool is typically only recorded when the beacon is stationary, such as when an additional pipe segment 28 is being added to the drill string 14. Thus, any power consumed by the beacon 40 while the downhole tool 30 and drill bit 24 are in motion is wasted.

In one embodiment, the beacon signal 32 is shut down, or placed into a lower power state, when a motion sensor 60 disposed in the downhole tool 30 indicates that the beacon 40 is not stationary. When the beacon becomes stationary, the beacon signal 32 renews and data is sent to the tracker.

Sensors that are capable of detecting motion are low power, and accuracy is not critical in such a motion sensor. Therefore, the power draw from such sensors is negligible. This method will therefore increase battery life in the beacon 40 without sacrificing depth performance or the strength of the beacon signal 32.

In one embodiment, the mode in which the beacon 40 is set may be configured via a Bluetooth command. For example, an operator may direct the beacon 40 to operate in a mode in which it is always broadcasting the beacon signal, or, optionally, to operate in the mode described above, where the beacon signal 32 is only broadcast when the beacon 40 is stationary.

Alternatively, the operator may selectively choose whether the beacon signal 32 is being broadcast, such that the beacon signal 32 is only being broadcast when tracking operations at the surface are active.

Battery Chemistry Detection

As the capability of beacons, such as beacon 40, continue to expand, higher power density batteries are used. Operators, however, will continue to use whatever batteries are available. As a result, it is advantageous for a beacon 40 to distinguish between different types of batteries so that the beacon 40 can be configured to operate within the constraints of the particular battery that is being used.

Figure 5:
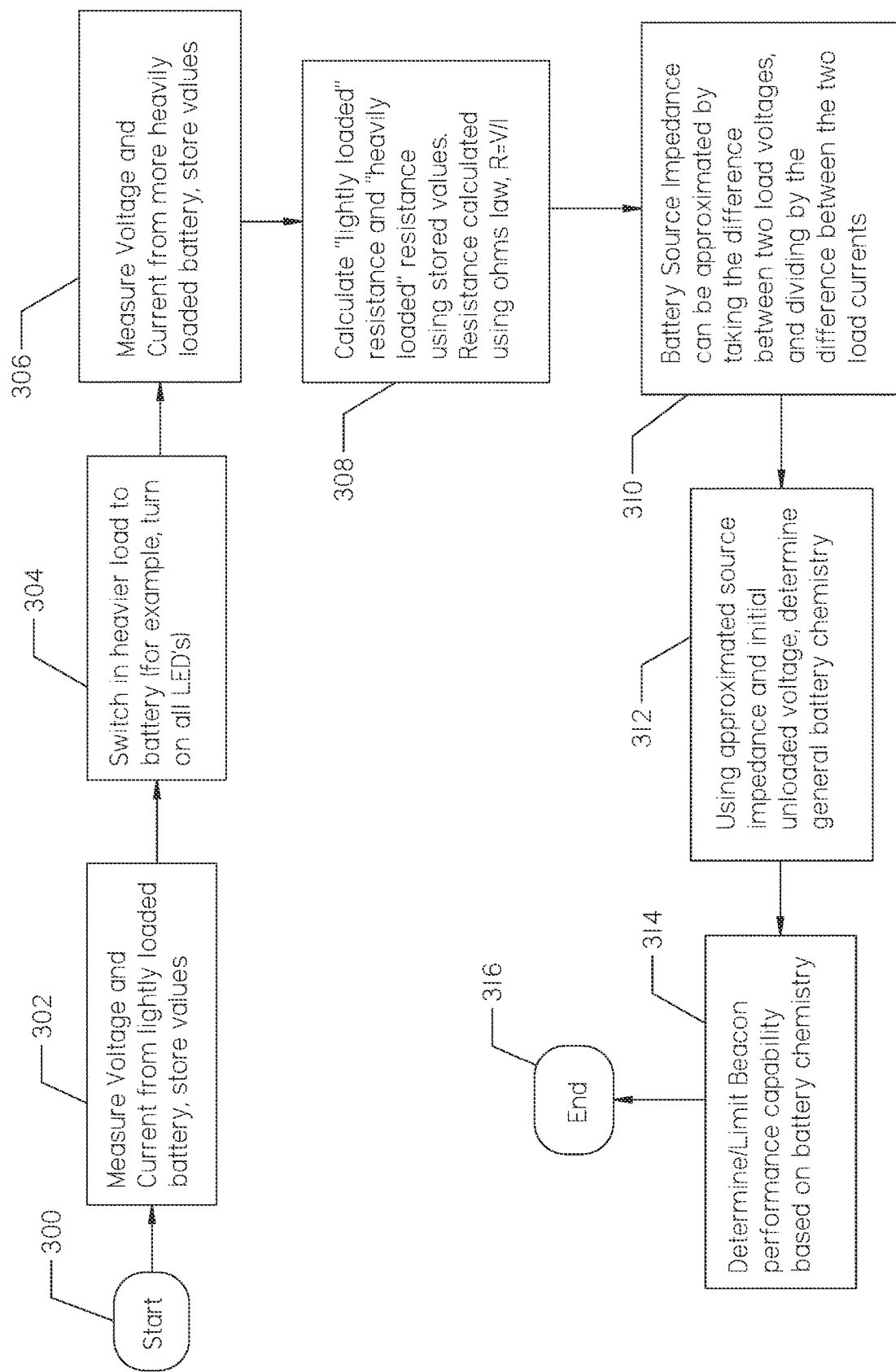
FIG. 5 is a flow chart of one example of a battery chemistry detection operation.

A method for battery chemistry detection is shown in FIG. 5. The method starts at step 300. At 302, voltage and current are measured under a light load. At 304, the load is increased on the battery. This step can be accomplished, for instance, by turning on lighting with the battery. As the battery is loaded, voltage and current are measured and values are stored at 306. The resistance of the battery when lightly loaded and when heavily loaded may then be calculated at 308. Resistance in the battery is calculated using Ohm's law—the voltage divided by the current.

At 310, the battery impedance can be approximated by taking the difference between the two load voltages and dividing by the difference between the two load currants. The difference between impedances measured using light load and heavy load is a good approximation of battery source impedance. At 312, the approximate impedance may be compared to the initial unloaded voltage to determine the battery chemistry. A table may show the source impedances vs. unloaded voltages.

Once the battery chemistry is known, assumptions about battery life and battery capability may be made at 314. For example, power consumption and rated battery life may be used to give a user a battery hour life expectancy instead of just a percentage based on battery voltage. A user can also use different settings in the beacon to limit power levels or frequencies that can be used with a given battery. This method also helps overcome Lithium Thionyl Chloride cell passivation. The method ends at 316.

While the above processes are described with reference to a horizontal directional drilling system, the processes may also be used in other operations or industries where beacons are used.

Changes may be made in the construction, operation and arrangement of the various parts, elements, steps, and procedures described herein without departing from the spirit and scope of the invention as described in the following claims.

The invention claimed is:

1. A method comprising:
   determining a theoretical optimum capacitance value for an antenna frequency;
   performing a series of measurements at an antenna transmitting at the antenna frequency, wherein each of the series of measurements is taken with the actual capacitance of the antenna at a value between a first and second boundary capacitance value, wherein the first boundary capacitance is less than the theoretical optimum capacitance value and the second boundary capacitance is more than the theoretical optimum capacitance value;
   using results of the series of measurements, determining an actual optimum capacitance value for the given antenna frequency;
   storing the actual optimum capacitance value in a memory;
   determining a first impedance of an antenna power source at a first voltage and a second impedance of the antenna power source at a second voltage;
   using the first impedance and second impedance, determining a battery chemistry of the antenna battery source; and
   storing the battery chemistry in a memory.

2. The method of claim 1 wherein the series of measurements comprises measuring feedback voltage.

3. The method of claim 1 wherein the series of measurements comprises measuring a current draw from a battery paired to the antenna.

4. The method of claim 1 wherein the first boundary capacitance is 10% less than the theoretical optimum capacitance value.

5. The method of claim 1 further comprising:
   with a drill string, advancing the antenna to an underground location; and
   at the underground location, transmitting a locating signal at the given frequency with the antenna's capacitance set to the actual optimum capacitance value.

6. The method of claim 1 wherein:
   the antenna comprises a capacitor bank with sixteen capacitors.

7. The method of claim 6 in which the capacitance of the antenna is adjusted by activating one or more of the capacitors of the capacitor bank.

8. The method of claim 1 further comprising:
   retrieving the actual optimum capacitance value from the memory;
   setting the antenna to the actual optimum capacitance value; and
   transmitting a location signal from the antenna at an underground location with the antenna at the actual optimum capacitance value.

9. The method of claim 1 further comprising:
   setting the capacitance of the antenna to the actual optimum capacitance value;
   determining a target power level for the antenna;
   with a digital to analog convertor, initiating an antenna signal at an initial output setting;
   while at the initial output setting, measuring the battery current and battery voltage to determine a measured power; and comparing the target power level to the measured power.

10. The method of claim 9 further comprising:
adjusting the antenna signal level to conform the measured power to the target power.

11. The method of claim 9 further comprising:
adjusting the antenna signal level until the measured power is greater than or equal to the target power.

12. The method of claim 9 wherein the target power level is characterized as a first target power level and further comprising:
determining a second target power level for the antenna;
with a digital to analog convertor, initiating an antenna signal at an initial output setting;
while at the initial output setting, measuring the battery current and battery voltage to determine a measured power; and
comparing the second target power level to the measured power;
wherein the second target power level is lower than the first target power level.

13. A beacon optimization system comprising:
an antenna coil configured to emit a locator signal;
a tunable capacitor bank coupled to the antenna coil;
a power source; and
a microprocessor;
wherein the microprocessor is configured to:
iteratively modify the capacitance of the tunable capacitor bank to optimize the magnitude of the locator signal at a given frequency;
iteratively modify the power supplied by the power source to optimize the current supplied to the antenna coil; and
calculate a first impedance of the power source using a light load and a second impedance of the power source using a heavy load to optimize the operation of the system passed upon a detected battery chemistry.

14. The beacon optimization system of claim 13 further comprising a storage, wherein the microprocessor is further configured to store the capacitance associated with the optimized magnitude of the locator signal in the storage.

15. A beacon optimization system comprising:
an antenna coil configured to emit a locator signal;
a tunable capacitor bank coupled to the antenna coil;
a power source;
a motion sensor configured to send a signal to the microprocessor indicating the motion sensor is moving;
a microprocessor;
wherein the microprocessor is configured to:
iteratively modify the capacitance of the tunable capacitor bank to optimize the magnitude of the locator signal at a given frequency;
iteratively modify the power supplied by the power source to optimize the current supplied to the antenna coil; and
decrease the power supplied by the power source in response to the signal from the motion sensor.

* * * * *